US006856536B2

(12) United States Patent
Rinerson et al.

(10) Patent No.: US 6,856,536 B2
(45) Date of Patent: Feb. 15, 2005

(54) NON-VOLATILE MEMORY WITH A SINGLE TRANSISTOR AND RESISTIVE MEMORY ELEMENT

(75) Inventors: Darrell Rinerson, Cupertino, CA (US); Christophe J. Chevallier, Palo Alto, CA (US)

(73) Assignee: Unity Semiconductor Corporation, Sunnyvale, CA (US)

(*) Notice: Subject to any disclaimer, the term of this patent is extended or adjusted under 35 U.S.C. 154(b) by 0 days.

(21) Appl. No.: 10/249,848

(22) Filed: May 12, 2003

(65) Prior Publication Data

US 2004/0160817 A1 Aug. 19, 2004

Related U.S. Application Data

(60) Provisional application No. 60/422,922, filed on Oct. 31, 2002, and provisional application No. 60/400,849, filed on Aug. 2, 2002.

(51) Int. Cl.[7] .............................................. G11C 11/00
(52) U.S. Cl. ...................... 365/148; 365/100; 365/163
(58) Field of Search ................................ 365/100, 148, 365/163, 158, 171, 173

(56) References Cited

U.S. PATENT DOCUMENTS

| | | | |
|---|---|---|---|
| 5,946,227 A | 8/1999 | Naji | 365/158 |
| 6,055,178 A | 4/2000 | Naji | 365/158 |
| 6,097,625 A * | 8/2000 | Scheuerlein | 365/171 |
| 6,111,781 A | 8/2000 | Naji | 365/158 |
| 6,178,131 B1 | 1/2001 | Ishikawa et al. | 365/225.7 |
| 6,191,972 B1 * | 2/2001 | Miura et al. | 365/171 |
| 6,204,139 B1 | 3/2001 | Liu et al. | 438/385 |
| 6,478,106 B2 * | 11/2002 | Hawener et al. | 180/232 |
| 6,531,371 B2 * | 3/2003 | Hsu et al. | 438/385 |
| 6,731,528 B2 * | 5/2004 | Hush et al. | 365/100 |

OTHER PUBLICATIONS

Liu, S.Q., et al., "Electric–pulse–induced reversible resistance change effect in magnetoresistive films", Applied Physics Letters, vol. 76, No. 19, May 8, 2000, 2749–2651.
Liu, S.Q., et al., "A New Concept For Non–Volatile Memory: Electric–Pulse Induced Reversible Resistance Change Effect in Magnetoresistive Films", Space Vacuum Epitaxy Center, University of Huston, Huston TX, 7 Pages.
Beck, A. et al., "Reproducible switching effect in thin oxide films for memory applications", Applied Physics Letters, vol. 77, No. 1, Jul. 3, 2000, 139–141.
Rossel, C. et al., "Electrical current distribution across a metal–insulator–metal structure during bistable switching", Journal of Applied Physics, vol. 90, No. 6, Sep. 15, 2001, 2892–2898.
Watanabe, Y. et al., "Current–driven insulator–conductor transition and nonvolatile memory in chromium–doped $SrTiO_3$ single crystals", Applied Physics Letters, vol. 78, No. 23, Jun. 4, 2001, 3738–3740.

* cited by examiner

*Primary Examiner*—Son Mai
(74) *Attorney, Agent, or Firm*—Morgan Malino

(57) ABSTRACT

Non-volatile memory cell with a single semiconductor device per memory cell. The present invention generally allows for a plurality of memory cells to be formed on a semiconductor substrate that supports a semiconductor device. A multi-resistive state material layer that changes its resistive state between a low resistive state and a high resistive state upon application of a voltage pulse is formed above the substrate, generally at a very high temperature. While the layers fabricated between the substrate and the multi-resistive state material use materials that can withstand high temperature processing, the layers fabricated above the multi-resistive state material do not need to withstand high temperature processing.

8 Claims, 11 Drawing Sheets

NON-VOLATILE MEMORY WITH A SINGLE TRANSISTOR AND RESISTIVE MEMORY ELEMENT

CROSS REFERENCE TO RELATED APPLICATIONS

This application claims the benefit of U.S. Provisional Application No. 60/400,849, filed Aug. 2, 2002, and the U.S. Provisional Application No. 60/422,922, filed Oct. 31, 2002, both of which are incorporated herein by reference in their entireties and for all purposes. This application is related to the following U.S. Patent Applications: U.S. application Ser. No. 10/360,005, filed Feb. 7, 2003; U.S. application Ser. No. 10/330,512, filed Dec. 23, 2002; application Ser. No. 10/330,153, filed Dec. 23, 2002; application Ser. No. 10/330,964, filed Dec. 23, 2002; application Ser. No. 10/330,170, filed Dec. 23, 2002; application Ser. No. 10/330,900, filed Dec. 23, 2002; application Ser. No. 10/330,150, filed Dec. 23, 2002; and application Ser. No. 10/330,965, filed Dec. 23, 2002; all of which are hereby incorporated herein by reference in their entireties and for all purposes. This application is additionally related to the U.S. Patent Applications titled "Memory Array of a Non-Volatile RAM" filed on May 12, 2003, U.S. application Ser. No. 10/249,846, hereby incorporated herein by reference in its entirety and for all purposes.

BACKGROUND OF INVENTION

1. Field of the Invention

The present invention relates generally to memory, and more specifically to nonvolatile RAM.

2. Description of the Related Art

Memory can either be classified as volatile or nonvolatile. Volatile memory is memory that loses its contents when the power is turned off. Some solid-state memory devices do not require a continuous power supply to retain information.

Certain complex metal oxides (CMOs), for example, can retain a resistive state after being exposed to an electronic pulse, which can be generated from two terminals. U.S. Pat. No. 6,204,139, issued Mar. 20, 2001 to Liu et al., incorporated herein by reference for all purposes, describes some perovskite materials that exhibit such characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films,"in materials for the 2001 Non-Volatile Memory Technology Symposium, all of which are hereby incorporated by reference for all purposes. However, the materials described in the U.S. Pat. No. 6,204,139 patent is not generally applicable to RAM memory because the resistance of the material, when scaled to small dimensions, is considered to be too large to make a memory with fast access times.

Similarly, the IBM Zurich Research Center has also published three technical papers that also discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped $SrTiO_3$ single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

The discovery of the resistance-changing property of certain CMOs, however, is relatively recent and has not yet been implemented in a commercially viable memory product. There are continuing efforts to bring a true nvRAM to market.

SUMMARY OF INVENTION

The present invention generally allows for non-volatile memory cell that retains information even if power ceases to be supplied to the memory cell. In one aspect, a non-volatile RAM memory array includes a plurality of memory cells formed on a semiconductor substrate, each individual cell capable of being selected with a select line and a data line. Each individual cell contains a semiconductor device and a multi-resistive state material.

The semiconductor device controls current flow between the data line and the reference line depending on the voltage of the select line. Located between the data line and the reference line is the multi-resistive state material, which changes its resistive state from a high resistive state to a low resistive state upon application of a first voltage pulse across the multi-resistive state material and changes its resistive state from the low resistive state to the high resistive state upon application of a second voltage pulse across the multi-resistive state material. The second voltage pulse across the multi-resistive state material is of opposite polarity to the first voltage pulse. The resistive state of the multi-resistive state material then determines the information stored in the memory cell.

In another aspect of the invention the semiconductor device is formed on a silicon substrate and two electrode layers are used. The multi-resistive state material layer is formed on the first electrode layer and the second electrode layer is formed on the multi-resistive state material, making a sandwich-like memory plug.

BRIEF DESCRIPTION OF DRAWINGS

The invention may best be understood by reference to the following description taken in conjunction with the accompanying drawings, in which.

It is to be understood that, in the drawings, like reference numerals designate like structural elements. Also, it is understood that the depictions in the figures are not necessarily to scale.

DETAILED DESCRIPTION

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The present invention generally allows for multi-resistive state materials to be used as memory elements in a non-volatile RAM memory. Multi-resistive state materials generally require high temperature processing, which limits the types of material that can be used prior to the multi-resistive state material deposition. A non-volatile RAM chip that only uses materials that can withstand the high temperature processing below the multi-resistive state material is free to use regular materials above the multi-resistive state material, since those materials are not subjected to high temperature processing.

Figure 1A:
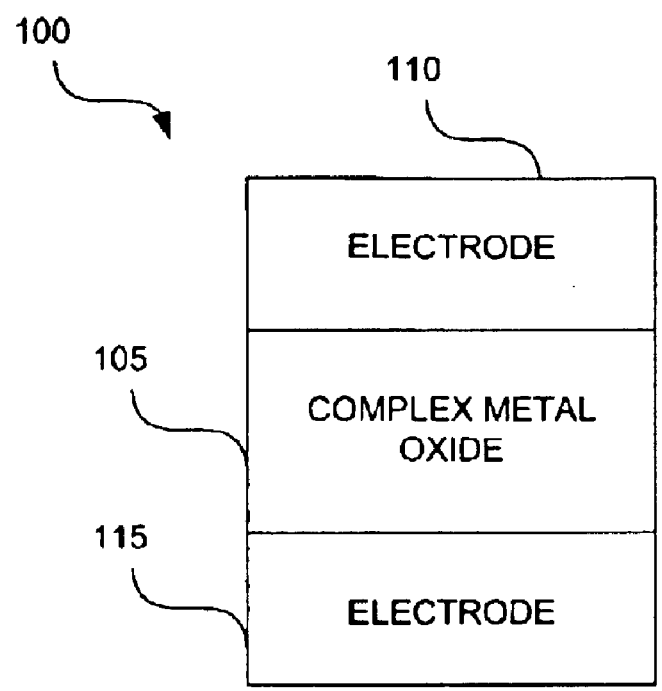
FIG. 1A depicts a block diagram of a resistive memory plug.

FIG. 1A depicts a block diagram of a resistive memory plug 100. The memory plug 100 is typically made from a thin film of multi-resistive state material 105 placed between two electrodes 110 and 115. Although the electrodes themselves 110 and 115 are essentially passive to the operation of the memory plug, the interfaces between the electrodes 110 and 115 and the multi-resistive state material 105 may contribute to the resistive properties of the memory plug 100. Electrodes 110 and 115 should have significantly less resistance than the resistance of the multi-resistive state material 105 and should be of a constant resistance so as to not directly contribute to the electrical switching properties of the memory cell. Typically, electrodes 110 and 115 would be as thin as possible while still preventing metal inter-diffusion and, if necessary, being useful as a seed layer and providing the active layer or layers.

Typical electrodes 110 and 115 commonly used in fabrication include Pt, Au, Ag and Al. If the electrodes 110 and 115 are used only as a barrier to prevent metal inter-diffusion, then a thin layer of metal, e.g. TiN, could be used. If a seed layer is additionally required, any number of electrically conductive materials can be used for on top of the thin layer of metal. For example, the seed layer could be a conductive perovskite, such as $LaNiO_3$ or $SrRuO_3$ on Pt, a conductive metal oxide, such as $IrO_2$ on Ir or $RuO_2$ on Ru, a noble metal such as Pt on TiN. It will be appreciated that the choice of electrode layers 110, 115 in combination with the multi-resistive state material layer 105 may affect the properties of the memory element. As such, the memory function is realized either by the multi-resistive state material 105 properties or by the interface between an electrode 110 or 115 and the multi-resistive state material 105. Therefore all three layers 110, 115 and 105 of the memory plug 100 can be considered as active layers.

The multi-resistive state material 105 will generally be a crystalline or polycrystalline structure. One class of multi-resistive state material 105 are perovskites that include two or more metals, the metals being selected from the group consisting of transition metals, alkaline earth metals and rare earth metals. The perovskites can be any number of compositions, including manganites (e.g., $Pr_{0.7}Ca_{0.3}MnO_3$, $Pr_{0.5}Ca_{0.5}MnO_3$ and other PCMOs, LCMOs, etc.), titanates (e.g., STO:Cr), zirconates (e.g., SZO:Cr, $Ca_2Nb_2O_7$:Cr, and $Ta_2O_5$:Cr), and high Tc superconductors (e.g., YBCO). Specifically, $MnO_3$, when combined with the rare earth metals La, Pr or some combination thereof and the alkaline earth metals Ca, Sr or some combination thereof have been found to produce a particularly effective multi-resistive state material 105 for use in the memory plug 100.

Multi-resistive state materials 105 are not limited to perovskites. Specifically, any material that uses trapped charges to modify or alter conductivity could be used in the memory plug 100. Doping different materials (e.g., insulators, conductors, conductive oxides, and/or polymers), for example, may create charge traps by substituting the dopant for crystalline elements. Doping may also be used to create charge traps by interstitially introducing dopants into a crystalline structure. Also, introducing separate physical clusters into a crystalline structure may additionally create charge traps.

The resistance changing effect of the multi-resistive state material 105 is generally not dependent upon the area of the multi-resistive state material 105 or of its thickness. However, the resistance value is inversely proportional to the area of the thin film resistance and proportional to the thickness of the multi-resistive state material 105. Additionally, the voltage at which multi-resistive state material 105 switches resistive states is dependent upon its thickness. The area and the thickness of the multi-resistive state material 105 as well as its resistivity will determine both the lowest possible resistance state and the highest possible resistive state. Although the highest operational resistive state ($R_0$) of the memory plug 100 does not need to be its highest possible state and the lowest operational resistance state ($R_1$) does not need to be its lowest possible state, designs can set $R_0$ and $R_1$ close to those states for simplicity.

When considering an operative value of the $R_1$ resistive state parasitic resistances that are in series with the memory plug must also be considered. Sources of resistance include the contacts and the vias, the metal interconnect lines, and the driver circuits. Parasitic resistances might total 100–200 $\Omega$, which puts a lower limit on the value of the memory plug resistance. While the problem can be overcome through more complicated circuit design, such designs typically result in loss of access time. Additionally, if the memory plug resistance is too high, then the RC delays in the circuit will be long, increasing the access time.

Therefore, the $R_1$ state of the memory plug would have a best value of 10 k$\Omega$ to 100 k$\Omega$. However, workable values may also be achieved with resistances between 5 k$\Omega$ to 1 M$\Omega$. If the $R_1$ state resistance is much less than 10 k$\Omega$, access time will be increased because of the effect of the parasitic resistances. If the $R_1$ state value is much above 100 k$\Omega$, the RC delays will increase access time.

Although very dramatic differences between a $R_1$ and $R_0$ could be sensed very easily, the voltage that drives very high resistances would be less than ideal. Since large currents can be destructive to semiconductors fabricated to small dimensions, no more than 10 $\mu$A would be desired for a memory circuit in most cases. Conversely, small differences, while workable in certain applications, result in difficulties in sensing the change in resistance and an increased access time. Typically, a single state memory would have the operational resistances of $R_0$ and $R_1$ separated by a factor of 10.

For example, if 1 volt were used as a read voltage ($V_R$), $R_1$ might be about 100 k$\Omega$ and $R_0$ might be about 1 M$\Omega$, making the current either 10 $\mu$A or 1 $\mu$A, depending on the resistive state. Once a $V_R$ is identified, a desired write voltage ($V_W$) can also be determined. Not only should $V_W$ be greater than $V_R$, but it should also be far enough away from $V_R$ to allow minor voltage fluctuations (e.g., due to fabrication imperfections) to have a negligible effect on the multi-resistive state material 105. Similarly, $V_W$ should be greater than $V_{Wth}$ for the same reason. A typical $V_W$ might be about 2 volts, and $V_{Wth}$ might be about 1.5 volts.

However, it should be noted that changes greater than a factor of 10 might be desirable in multi-bit resistive memory cells. Generally, adjusting the pulse width and magnitude of the voltage pulses across the multi-resistive state material material results in multiple resistive states. Since multi-resistive state material 105 can be placed into several different resistive states, multi-bit resistive memory cells are possible. For example, the multi-resistive state material material might have a high resistive state of $R_{00}$, a medium-high resistive state of $R_{01}$, a medium-low resistive state of $R_{11}$ and a low resistive state of $R_{11}$. Since multi-bit memories typically have access times longer than single-bit memories, using a factor greater than a 10 times change in resistance from $R_{11}$ to $R_{00}$ is one way to make a multi-bit memory as fast as a single-bit memory. For example, a memory cell that is capable of storing two bits might have the low resistive state be separated from the high resistive state by a factor of 100. A memory cell that is capable of storing three or four bits of information might require the low resistive state be separated from the high resistive state by a factor of 1000. Typically, the intermediary resistive states in a multi-bit memory would evenly subdivide the resistive range between the high resistive state and the low resistive state on a logarithmic scale. For example, if a memory cell that held three bits of memory had a low resistive state of 10 k$\Omega$, the six intermediary states might have resistive states of about 26.8 k$\Omega$, 72.0 k$\Omega$, 193 k$\Omega$, 518 k$\Omega$, 1.39 M$\Omega$, and 3.73 M$\Omega$. The highest resistive state would then be 10 M$\Omega$, 1000 times the value of the low resistive state. Each optimal resistive state could easily be calculated by using the relationship $\text{Log}(R_{110})=\text{Log}(R_{111})+\text{Log K}$; $\text{Log}(R_{101})=\text{Log}(R_{111})+2 \text{ Log K}$; $\text{Log}(R_{100})=\text{Log}(R_{111})+3 \text{ Log K}$; ... $\text{Log}(R_{000})=\text{Log}(R_{111})+7 \text{ Log K}$, where $\text{Log K}=(1/7)[\text{Log}(R_{000})-\text{Log}(R_{111})]$.

Those skilled in the art will appreciate that the above-described voltages are voltages seen by the multi-resistive state material 105, and not necessarily the absolute values of the voltages from ground. For example, if the top electrode 110 was held to 10 volts and the bottom electrode 115 was held to 8 volts, the multi-resistive state material 105 would still attain a 2-volt drop. An opposite polarity voltage would then be attained whenever the bottom electrode 115 was held to a larger voltage than the top electrode 110. Different designs might then use different methods to create a voltage drop of opposite polarity and equal magnitude. Taking the example of the top electrode 110 being held to 10 volts and the bottom electrode 115 being held to 8 volts, one design might hold the top electrode 110 to the same 10 and change only the voltage on the bottom electrode 115 to 12 volts in order to attain a voltage drop of opposite polarity and equal magnitude. An alternative design might reverse the voltages on the electrodes, holding the bottom electrode 115 to 10 volts and the top electrode 110 to 8 volts so that neither electrode would experience a change in voltage of more than 2 volts.

Ideally, the multi-resistive state material 105 should switch very quickly from one resistive state to another. For current applications, anything less than 50 nanoseconds would be an appropriate switching speed. Additionally, once the multi-resistive state material 105 is placed in a resistive state, it should be able to retain that state for long periods of time. Ideally, the material should retain its resistive state for over ten years. Since the read voltage should not affect the resistive state, repeated application of the read voltage over ten years should not change the resistive state of the multi-resistive state material 105.

Generally, the chemical and materials properties of the multi-resistive state material 105 are selected to meet the electrical specifications set forth above. For example, the material preferably has a resistivity of not greater than about 1 $\Omega$-cm (although 5 $\Omega$-cm may be a workable value), exhibits a change in resistance of at least about 10×, and has this resistance change triggered by the application of a voltage pulse of not longer than about 100 ns duration and not greater than about than 10V in magnitude. In addition, the memory element material should be compatible with the requirements imposed by the general fabrication process of the entire high density RAM. Of course, there is some flexibility in the process constraints. Thus, process and design engineers will have certain ranges of chemical, materials, and process parameters available to tailor for the specific goals at hand. Among these parameters are the annealing conditions, the deposition temperature and method, and the material stoichiometry and the thickness.

To allow rapid access times (on the order of tens of nanoseconds) in small dimension devices (on the order of hundreds of nanometers), the memory element material resistivity should be optimized. The resistivity of the multi-resistive state materials depends upon various factors, often including some of the following: film thickness, oxygen content of the film, stoichiometry, elemental composition, deposition method and conditions, degree of crystallinity, crystallite size, crystalline orientation, and doping level and choice of dopant. Current research indicates that suitably low resistivity multi-resistive state material materials can be achieved by judicious choice of these parameters.

One example of a suitable film thickness for the memory applications of this invention is approximately 500 Å to 3000 Å. Thinner films sometimes have higher strains, usually resulting from a slight misalignment with the seed layer, which can result in higher resistivity. Film thickness has been discussed by S. I. Khartsev, et al. in "Colossal magnetoresistance in ultrathin epitaxial $La_{0.75}Sr_{0.25}MnO_3$ films," Journal of Applied Physics, Vol. 87, No. 5, 1 Mar. 2000, which is hereby incorporated by reference for all purposes.

Another factor that affects resistivity is the oxygen content of the film. By properly controlling the exposure to oxygen during deposition and annealing (if any) the resistivity can be controlled. It has been observed that 1500 Å lanthanum manganese oxide (LMO) films deposited by pulsed laser deposition in oxygen environments have a lower resistivity than films deposited in vacuum (but otherwise identical conditions). See Y. G. Zhao, et al., "Effect of oxygen content on the structural, transport, and magnetic properties of $La_{1-\delta}Mn_{1-\delta}O_3$ thin films," Journal of Applied Physics, Vol. 86, No. 11, 1 Dec. 1999, which is hereby incorporated by reference for all purposes. Cooling down the freshly deposited film in an oxygen-containing atmosphere further decreases film resistivity.

It has been further observed that adjusting the relative amounts of the rare earths and the alkaline earth metals can modify resistivity. Higher ratios of alkaline earth to rare earth metals can, to a degree (e.g., up to about 50:50 in lanthanum calcium manganese oxides), lower resistivity. See Guo-Qiang Gong, et al., "Colossal magnetoresistance of 1000000-fold magnitude achieved in the antiferromagnetic phase of $La_{1-x}Ca_xMnO_3$," Applied Physics Letters, Vol. 67, No. 12, 18 Sep. 1995, which is hereby incorporated by reference for all purposes.

Further, it has been found that some polycrystalline materials may have lower resistivities than their amorphous and single crystal counterparts. It has also been observed that magnitude of the resistance changes in single crystal multi-resistive state material films exceeds that of the polycrystalline films. Large changes (i.e., greater than about 10×), are, however, not typically necessary for making a practical memory chip.

In light of the above, some specific multi-resistive state materials suitable for use with this invention will have the following properties: (1) the thickness of the deposited multi-resistive state material film is between 500 Å and 3000 Å; (2) the deposition and cool down and post deposition annealing (if any) is performed in an oxygen rich ambient; (3) the ratio of the rare earth and alkaline earth metals is adjusted for lowest resistivity, e.g., about 0.5; (4) the material is deposited or annealed to give a polycrystalline structure; (5) the material is deposited or annealed to increase the percentage of crystallites in a preferred orientation; and (6) the multi-resistive state material is doped with a material that has the effect of pinning the oxygen vacancies and/or introducing trapping sites within the material, and/or altering the resistivity of the material.

In addition to the above properties, certain process and design features are important. First, the seed layer or other "substrate" on which the multi-resistive state material deposits impacts the resistivity of the multi-resistive state material and other properties. Often the underlying crystallographic orientation of the substrate will epitaxially propagate to the upper levels the multi-resistive state material element. So, for example, if the underlying substrate has a 100 orientation, then the multi-resistive state material may preferentially deposit in a 100 orientation. Preferably, the underlying substrate is a conductive electrode such a noble metal (e.g., platinum) or relatively conductive multi-resistive state material such as $LaNiO_3$. In polycrystalline structures, suitable crystallite sizes may range from about 100 Å to about 500 Å.

The general process operations for creating a multi-resistive state material memory plug include (1) providing a substrate on which to directly form the memory plug, (2) depositing the memory plug material on the substrate, and optionally (3) post-processing the deposited material to impart a desired property. As indicated above, the substrate material should be polycrystalline or single crystalline, be conductive, and serve as an electrode.

Various physical vapor deposition (PVD) and chemical vapor deposition (CVD) techniques may be employed. Many forms of PVD and CVD can be employed, assuming that they operate at temperatures compatible with the overall device fabrication technology. Post-processing operations must also meet the temperature strictures of the technology. Often, this means that the deposition process should operate at temperatures below 600° C.

Figure 1B:
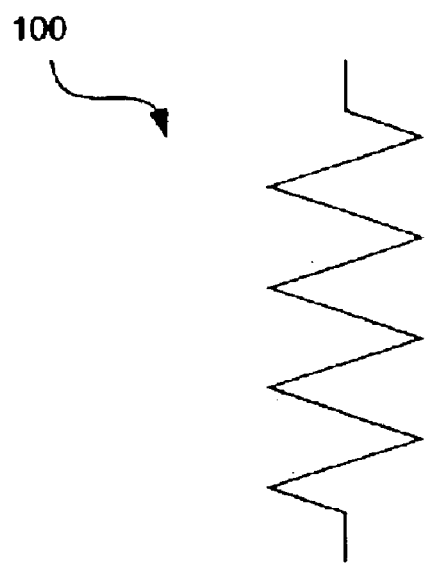
FIG. 1B depicts a schematic representation of the memory plug of FIG. 1A.
Figure 2:
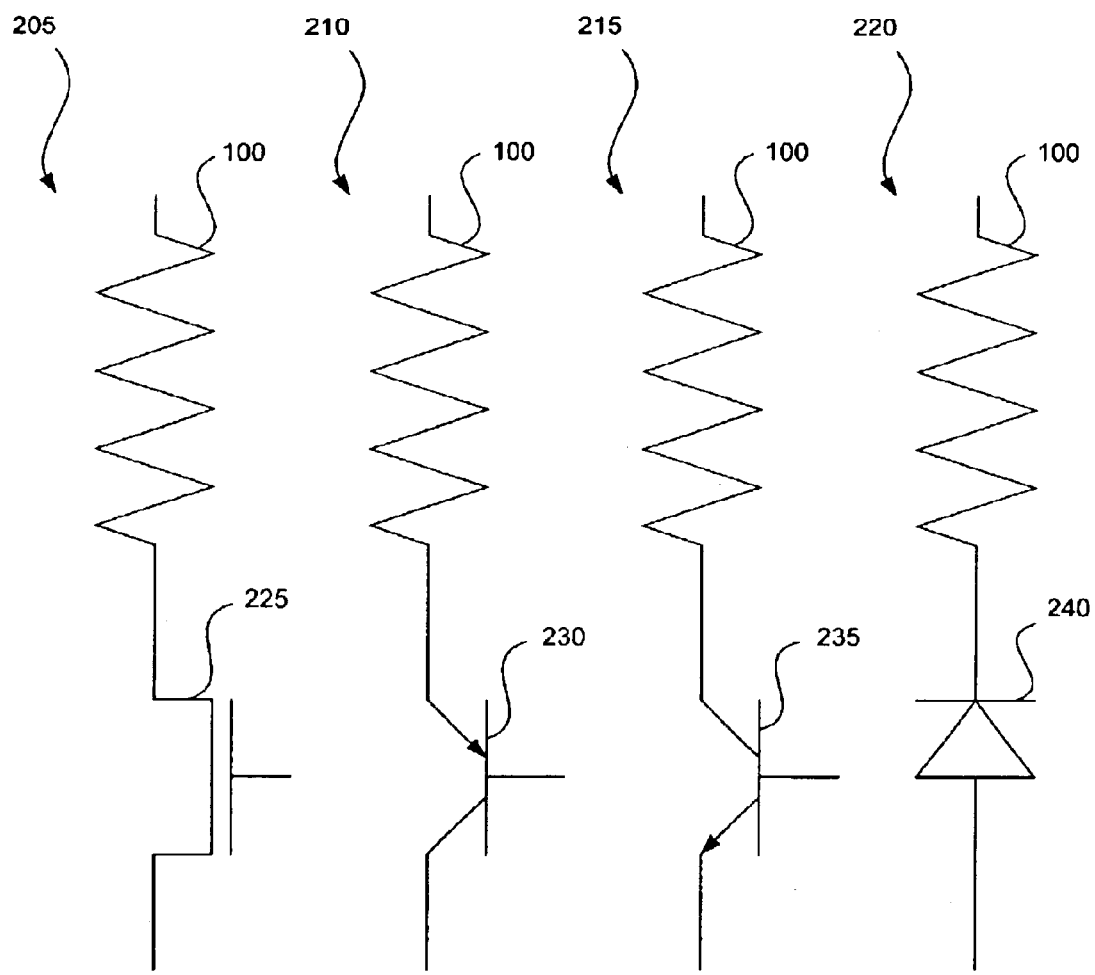
FIG. 2 depicts a schematic representation of various memory cells using a semiconductor device and the memory plug of FIG. 1B.

FIG. 1B is a schematic representation of the memory plug 100. To make a practical memory cell using a resistive memory plug 100, some type of semiconductor device should be placed in series with the resistive element 100. FIG. 2 is a schematic representation of various memory cells 205, 210, 215, and 220 using the memory plug 100. The memory cells 205, 210, 215, and 220 all use a semiconductor device in order to control access to the memory plug 100. Possible devices include a FET 225, a pnp transistor 230, a npn transistor 235, and a diode 240. Other devices, such as a parasitic vertical bipolar transistor that consists of a p junction and an N well in a p substrate, may also be used.

Figure 3A:
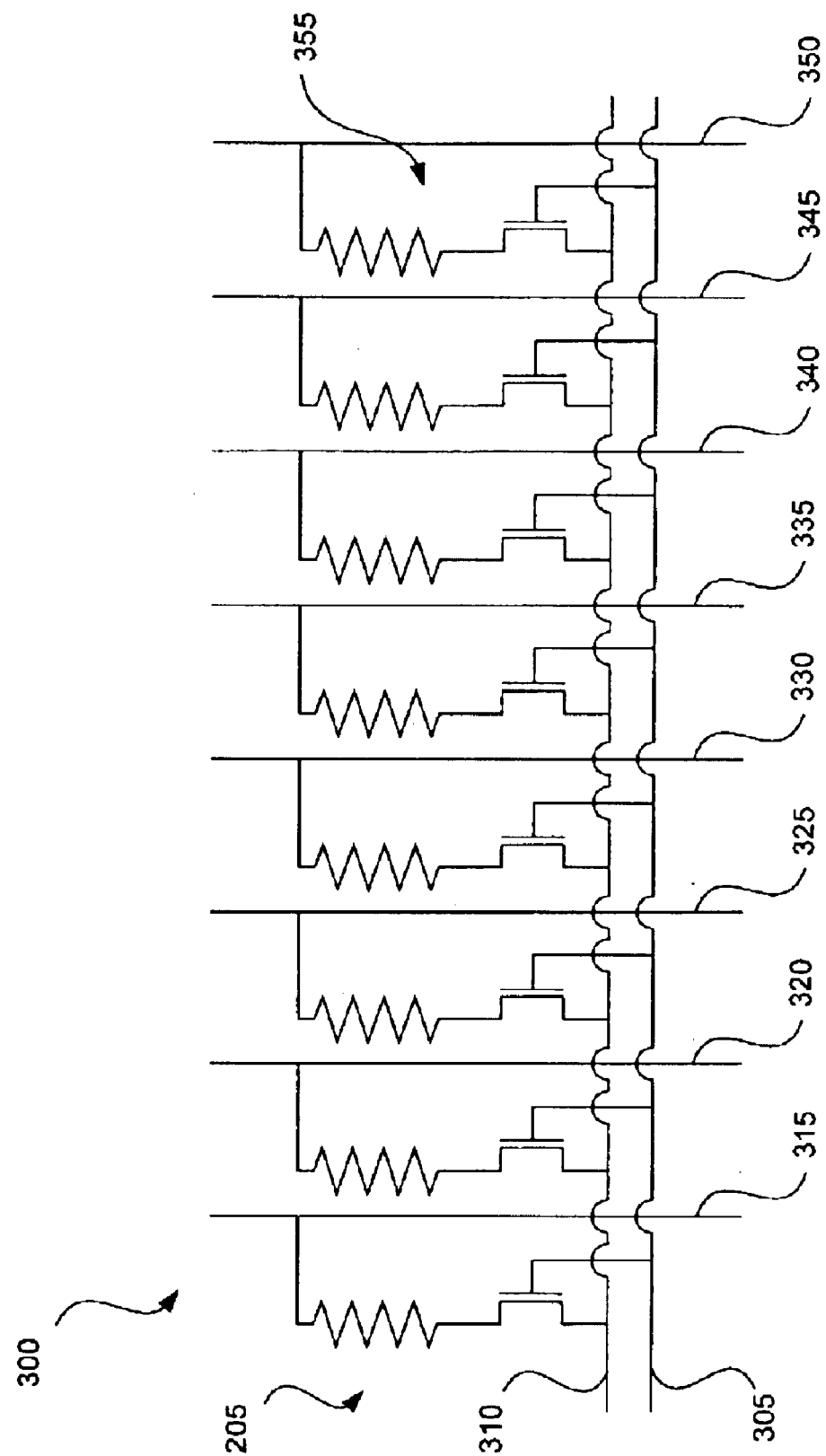
FIG. 3A depicts a schematic representation of a row of memory cells using a FET device, as shown in FIG. 2.

FIG. 3A is a schematic representation of an array 300 of memory cells 205. Each memory cell 205 in the array is connected to a select line 305, a reference line 310 and a plurality of data lines 315, 320, 325, 330, 335, 340, 345, and 350.

Activating the FET 225 requires a gate voltage that is above the threshold voltage of the FET 225. The select line 305, therefore, is used to activate all the FETs in a particular row of memory cells.

The data lines 315, 320, 325, 330, 335, 340, 345, and 350 both carry the data from the memory cells during READ operation and provides the memory cells with a voltage pulse appropriate to change the resistive state of the memory plug 100 during a WRITE operation. Selection circuitry can be used to select a specific data line 315, 320, 325, 330, 335, 340, 345 or 350 so that only the desired memory cells are accessed.

The reference line 310 provides a reference voltage to all the memory cells. The reference voltage is typically either ground (0V) or a constant supply voltage. In the case where more than one cell (e.g., 205 and 355) is selected at a time, and where one select line 305 is active and more than one data line (e.g., 315 and 350) is active, the resulting current from all the active data lines 315 and 350 would go through the cells 205 and 355 to the common reference line 310. This may be too much current for a single reference line 310, and may result in a voltage drop due to the parasitic resistance, especially in a large array. It could also affect the reliability of the reference line 310 due to electro-migration induced by too much current in the line. Techniques that address this issue are discussed in connection with FIG. 4.

Figure 3B:
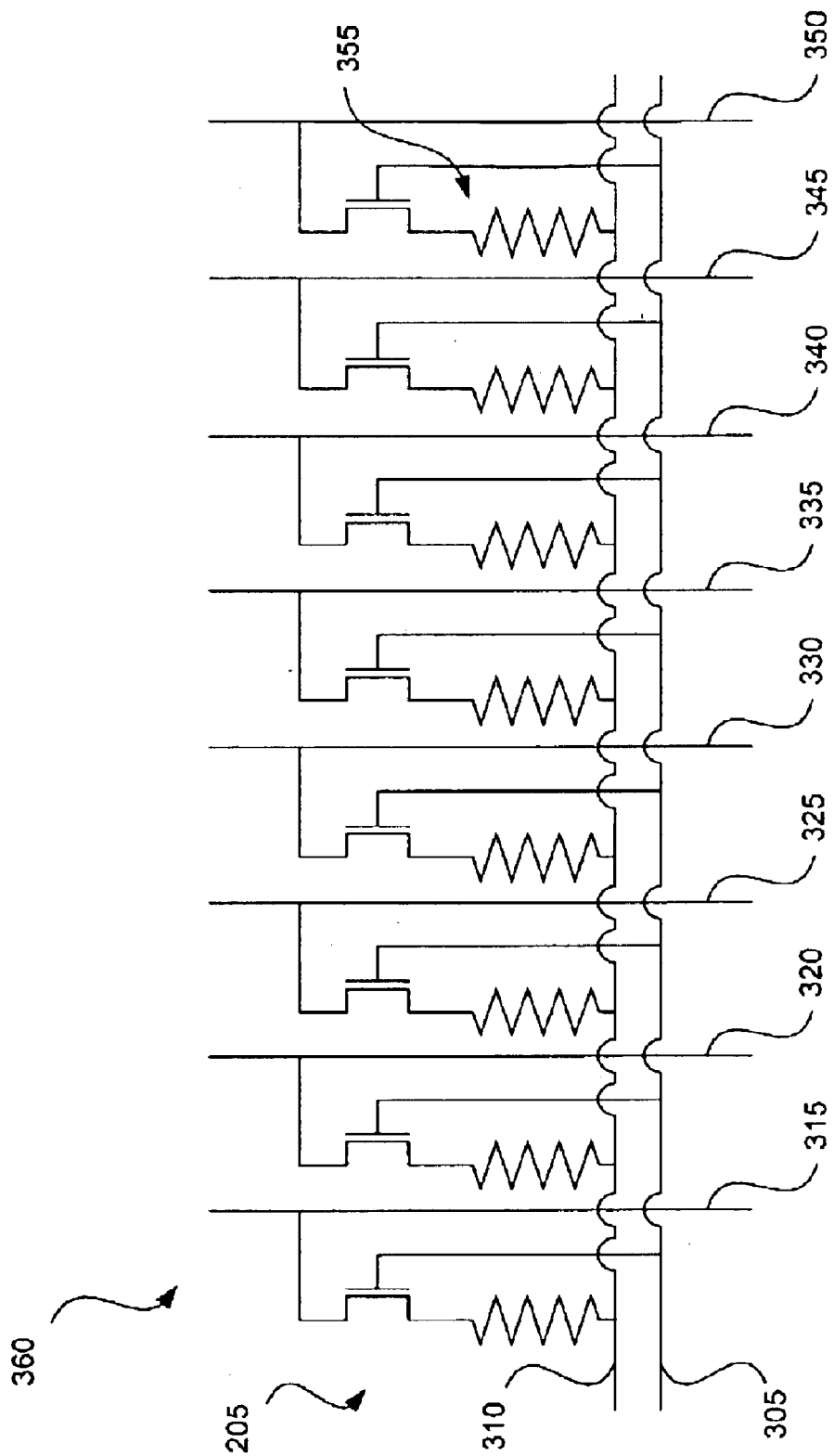
FIG. 3B depicts a schematic representation of a row of memory cells using an alternate arrangement than that of FIG. 3A.

The array 300 of FIG. 3A is subject to numerous modifications. For example, FIG. 3B is a schematic representation of an array 360 that has the memory cells flipped upside down so that the memory plug 100 is connected with the reference line 310 and the FET 225 is connected to the select line 305 and the appropriate data line 315.

In both configurations the transistor 225 is able to prevent the memory plug 100 from experiencing a voltage drop between the data line 315 and the reference line 310. However, the array 300 of FIG. 3A would still cause the memory plug 100 to experience voltage changes associated with the changing data line 315, but no voltage drop. In contrast, memory plug 100 in the configuration of FIG. 3B is subjected to the constant voltage of the reference line 310 for as long as the transistor 225 is not activated.

Figure 4:
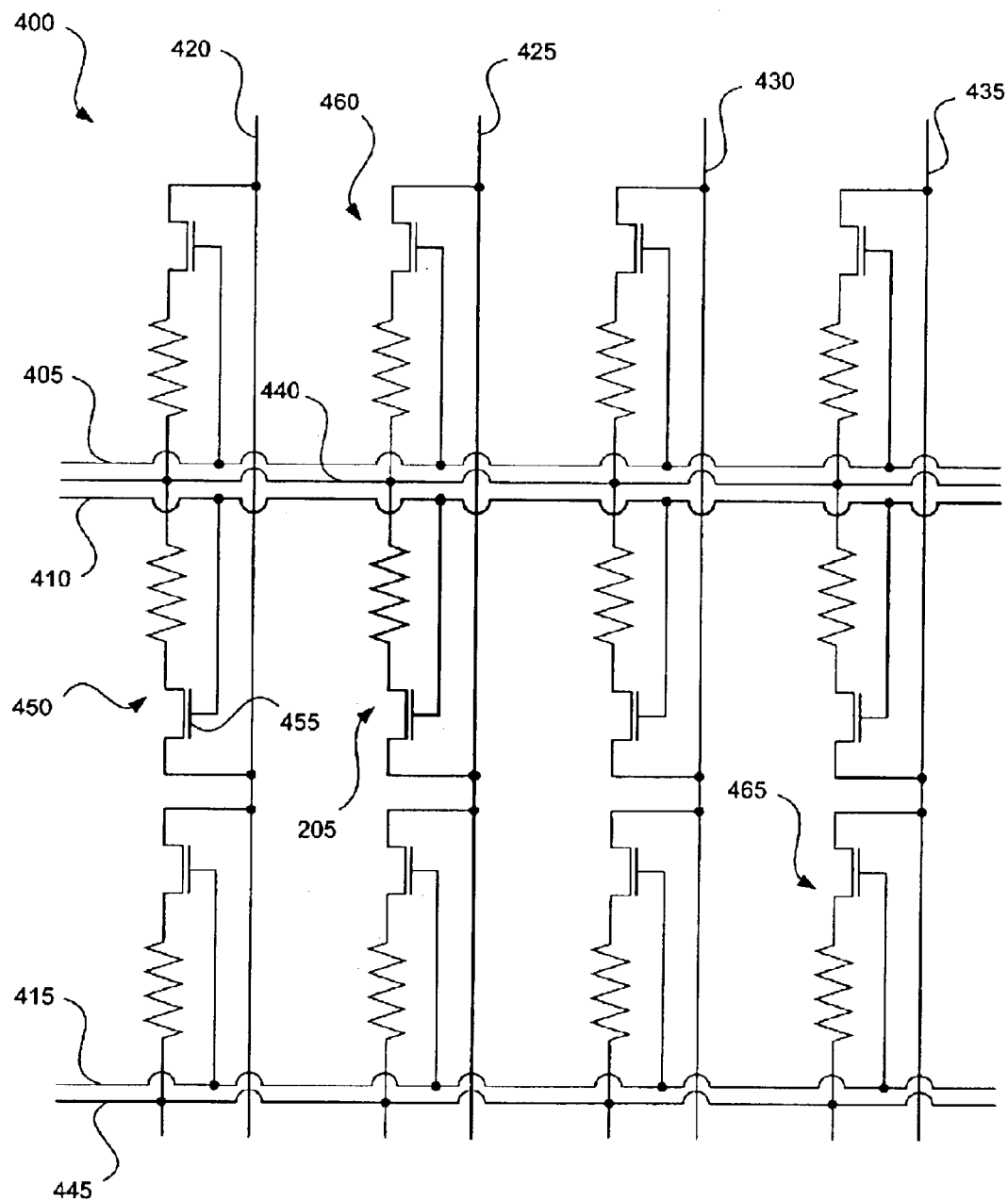
FIG. 4 depicts a schematic representation of an array of memory cells using the row arrangement of FIG. 3B.

Similarly, FIG. 4 is a schematic representation of an array 400 of memory cells laid out in a repeatable pattern in two dimensions. Although there are multiple select lines 405, 410, and 415, and data lines 420, 425, 430, and 435, each individual memory cell 205 can be uniquely defined by a single select line 410 and a single data line 425. Table 1 shows the operational voltages that could be applied to the array 400 in one possible embodiment of the invention.

TABLE 1

|  | Selected Data Line | Unselected Data Line | Selected Select Line | Unselected Select Line | Reference Line |
|---|---|---|---|---|---|
| Read | 1 V | Floating | 3 V | −2 V | 0 V |
| Write 1 | −2 V | Floating | 3 V | −2 V | 0 V |
| Write 0 | 2 V | Floating | 3 V | −2 V | 0 V |

In the embodiment of table 1, the reference lines 440 and 445 stay grounded. As previously described, activating more than one cell at a time may lead to voltage drops due to parasitic resistances. One technique that can be used to avoid this problem is to tie all the reference lines (e.g., 440 and 445) together at regular intervals. For example, including a line parallel to the data lines every 64 cells might ameliorate any unwanted voltage drops. Regardless of the technique used, it would generally be desirable to keep the reference line at a constant voltage.

During the READ operation, the selected memory plug 100 experiences a voltage drop of $V_R'$ ($V_R'$ is $V_R$ plus all other incidental voltage drops of the memory cell, such as from the electrodes 110 and 115 and the FET 225).

It should be noted that current also flows through the unselected memory plugs along the selected select line 410. An unselected memory plug 450 along the selected select line 410 would have its n-channel FET 455 active, allowing current to flow. However, since the decoding circuitry only reads information off of the selected data line 425, the current that flows through the unselected data lines 420, 430, and 435 is not relevant to determining the stored value in the selected memory cell 205. The voltage of the floating unselected data lines 420, 430, and 435 must not, however, exceed $|V_{Wth}'|$ ($V_{Wth}'$ is $V_{Wth}$ plus all other incidental voltage drops, such as from the electrodes 110 and 115) or else the floating voltages may alter the resistive states in the unselected memory cells. Alternatively, the unselected data lines 420, 430, and 435 might be held to some voltage in between $V_{Wth}'$ and $-V_{Wth}'$ (such as the reference voltage) if parasitic capacitance or some other correction mechanism was not thought to be sufficient to prevent the voltage from floating too high or too low.

Current does not flow through the other unselected memory plugs because their n-channel FETs do not have a gate voltage greater than the required threshold gate voltages. An unselected memory cell 460 along the selected data line 425 would have a gate voltage of −2V, which is lower than both the voltage of the selected data line 425, which is 1V, and the reference voltage, which is 0V. Of course, any value of 0V or less could be used for the unselected select lines 405 and 415 during the READ operation. As will be appreciated, the −2V value is simply used for convenience. Similarly, an unselected memory plug 465 along an unselected data line 435 and an unselected select line 415 would have a gate voltage of −2V, which is lower than both the unselected data line, which cannot float to less than −2V, and the reference voltage, which is 0V.

The WRITE 1 operation puts the memory plug 100 into the $R_1$ state. This can either be done only after a read to ensure that the memory plug 100 is not already in the $R_1$ state, or it can be done without a read if $R_1$ is the highest possible state. Similarly, the WRITE 0 operation puts the memory plug 100 into the $R_0$ state, which is typically the lowest possible resistive state of the memory plug 100. The unselected memory cells are not affected by either WRITE operation either because their gates are not activated or the unselected data lines only float between voltages of $V_{Wth}'$ and $-V_{Wth}'$.

To generate internal write voltages, two on chip voltage converters will convert the chip power supply, typically 3V or 1.8V, to the required value. One voltage converter, for example, could produce a 2V signal, and the other might produce a −2V signal.

Figure 5:
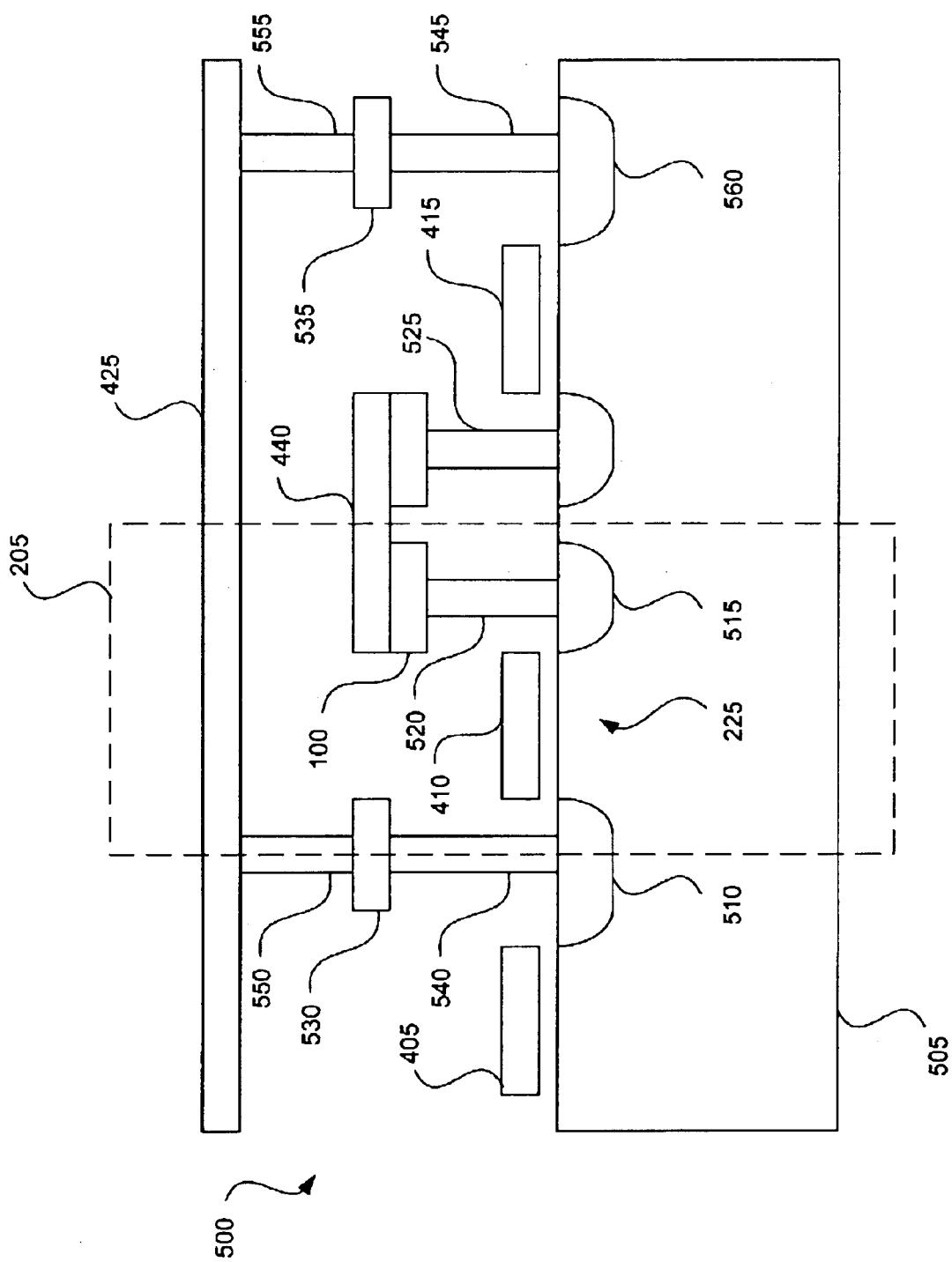
FIG. 5 depicts a cross sectional diagram of a portion of the memory chip that implements the schematic layout of FIG. 4.

FIG. 5 is a cross sectional diagram of a portion of the memory chip 500 that implements the schematic layout of FIG. 4. Three layers are used on top of the silicon wafer 505: one for the select lines 405, 410, and 415; one for the reference line 440; and one for the data line 425. The select lines 405, 410, and 415 can be polysilicon or possibly silicide to provide a direct gate voltages for the n-channel FETs, allowing current to flow through two p-type junctions 510 and 515 when activated.

Polysilicon and silicide have resistances of 3 to 30 Ω/□ where copper metal lines typically have resistances of less than 0.1 Ω/□. Therefore, certain embodiments may have the chip be much longer in the data line-direction than the select line-direction.

As previously discussed, the multi-resistive state material layer 105 may require very high temperatures to form the required polycrystalline or a single crystalline structure. Depending upon the fabrication process (e.g., solution based spin on followed by high temperature anneal, pulsed laser deposition, sputtering, and metalorganic chemical vapor deposition) the fabrication temperature might require that substances such as polysilicon, silicide, and/or refractory metals be used for the layers that are formed below the memory plug 100, such as the select lines 405, 410, and 415 and some vias 520 and 525. As long as no high temperature processes are required after the multi-resistive state material layer 105 is deposited, a more standard conductive metal (e.g., copper) can be used for the layers that come after the multi-resistive state material layer 105, such as the reference line 440, metal plugs 530 and 535, vias 540, 545, 550, and 555, and the data line 425. The metal plugs 530 and 535 are used to connect the vias 540 and 545 that are formed below the reference line 440 metalization layer and the vias 550 and 555 that are formed above the reference line 440 metalization layer so that the data line 425 is connected to the p junctions 510 and 560.

FIGS. 6–10 describe one possible technique that can be used to fabricate the cell 205, using specific materials. It should be understood that the described materials, processes and thicknesses are not the only embodiment that can be used.

Figure 6:
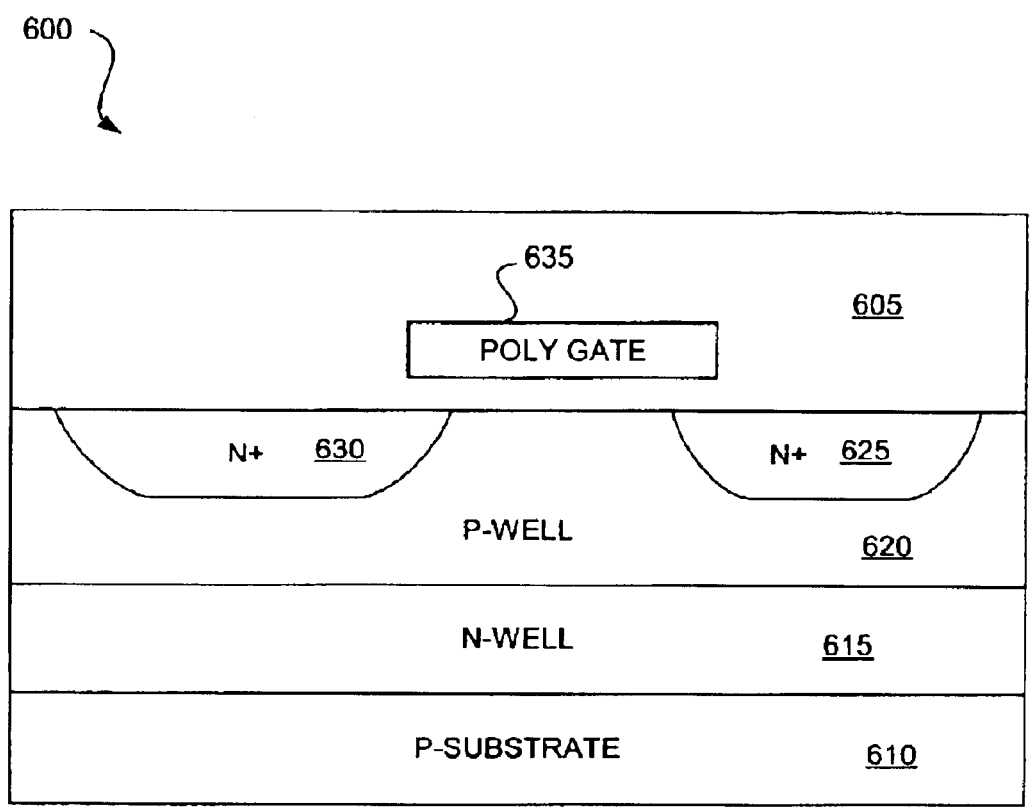
FIG. 6 depicts a cross sectional diagram of a partially formed cell after standard front end of line processes are completed.

FIG. 6 is a cross sectional diagram of a partially formed cell 600 after standard front end of line (FEOL) processes are completed. FEOL processes are generally defined as operations performed on a semiconductor wafer in the course of device manufacturing up to first metallization, and might end with chemical-mechanical polishing (CMP) of $SiO_2$ as an inter-layer dielectric (ILD) 605.

FIG. 6 shows a p-type substrate 610, which lies beneath an n-well 615, which, in turn, is underneath a p-well 620. N-junctions 625 and 630 are formed in the p-well 620. Since the data lines may be at −2V, the isolated p-well 620 allows the n-junctions 625 and 630 to always be reverse-biased, even at negative voltages. The select line 635 can be formed as a standard polysilicon gate.

Figure 7:
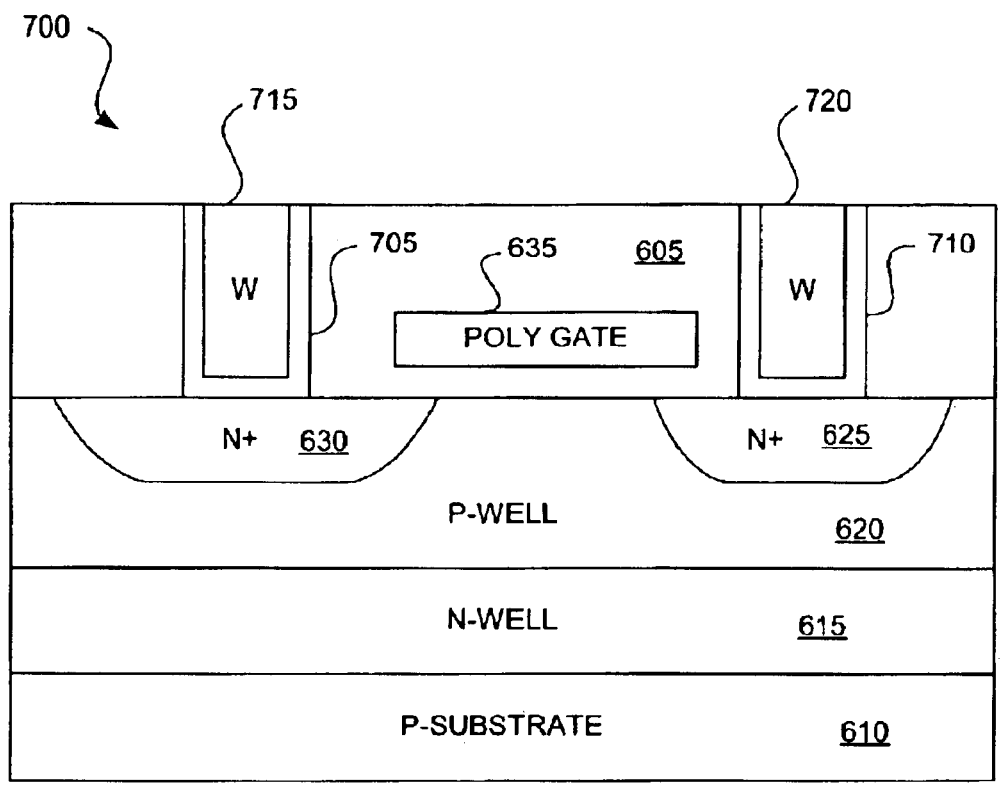
FIG. 7 depicts a cross sectional diagram of the partially formed cell of FIG. 6 after tungsten plug formation.

FIG. 7 is a cross sectional diagram of a partially formed cell 700 after tungsten (W) plug formation. After the FEOL process, the next processing step is formation of contact holes through the ILD 605. A barrier/adhesion layer 705 and 710 of 100 Å of Ti followed by 200 Å of TiN can be sputtered on the wafer, followed by 5000 Å of W, deposited using CVD, followed by etchback or CMP to remove W on the ILD 605 surface, leaving W plugs 715 and 720 in the contact holes.

Figure 8:
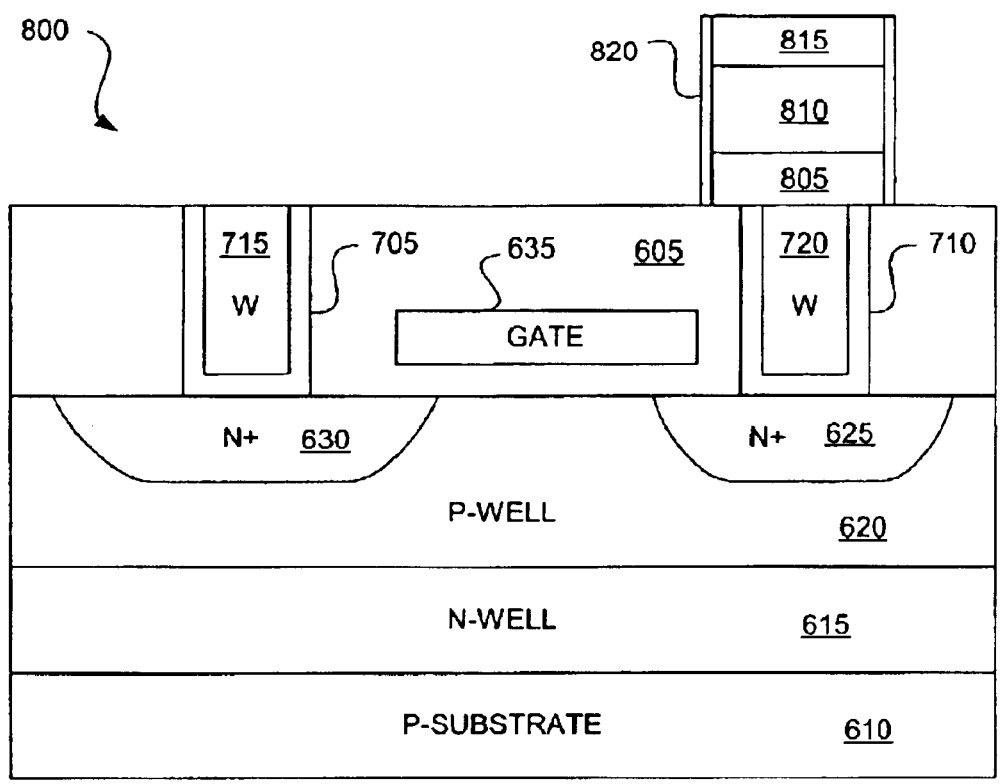
FIG. 8 depicts a cross sectional diagram of the partially formed cell of FIG. 7 after the memory plugs are formed.

FIG. 8 is a cross sectional diagram of a partially formed cell 800 after the memory plugs are formed. First, the bottom electrode 805 is deposited. The bottom electrode 805 can have two layers, a 500 Å thick barrier layer of TiAlN to prevent metal inter-diffusion, followed by a 200 Å seed layer of $LaNiO_3$. These layers can be deposited by sputtering.

2000 Å of memory material 810 having a stoichiometry of $Pr_{0.7}Ca_{0.3}MnO_3$ can then be deposited at about 600° C. by a physical vapor deposition technique such as sputtering, and then annealed. The top electrode 815 (200 Å of $SrRuO_3$ and another 500 Å of TiAlN) is deposited on top of the memory element 810 via sputtering. Standard photolithography and appropriate multi-step etch processes can then be used to pattern the electrode/memory/electrode layers into memory cell plug. 250 Å of $Si_3N_4$ or $TiO_2$ might then be deposited as an etch stop/diffusion barrier 820, to protect the PCMO film from inter-diffusion.

Figure 9:
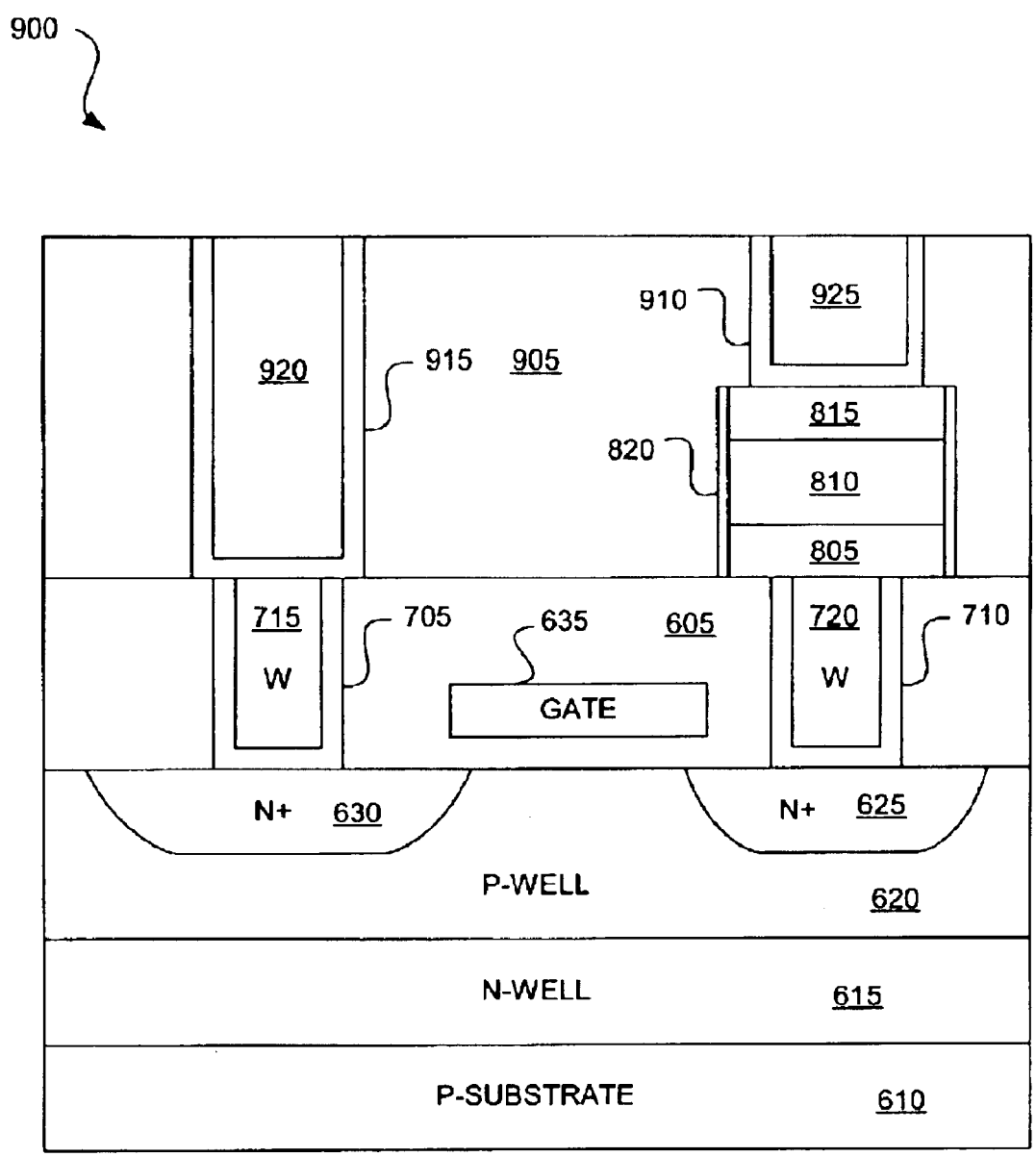
FIG. 9 depicts a cross sectional diagram of the partially formed cell of FIG. 8 after the second set of W plugs are formed.

FIG. 9 is a cross sectional diagram of a partially formed cell 900 after the second set of W plugs are formed. After the memory plug is fully formed, a thick $SiO_2$ layer as a second ILD 905 is deposited and planarized by CMP. The via holes are then formed with standard photolithography and via etch. The via holes could be filled by depositing a barrier/adhesion layer 910 and 915 of 100 Å of Ti, followed by 200 Å of TiN, followed by W plug layer 920 and 925 of 5000 Å of W. CMP could then be used to remove W on the ILD surface 905, leaving the W plugs 920 and 925 in the via holes.

Figure 10:
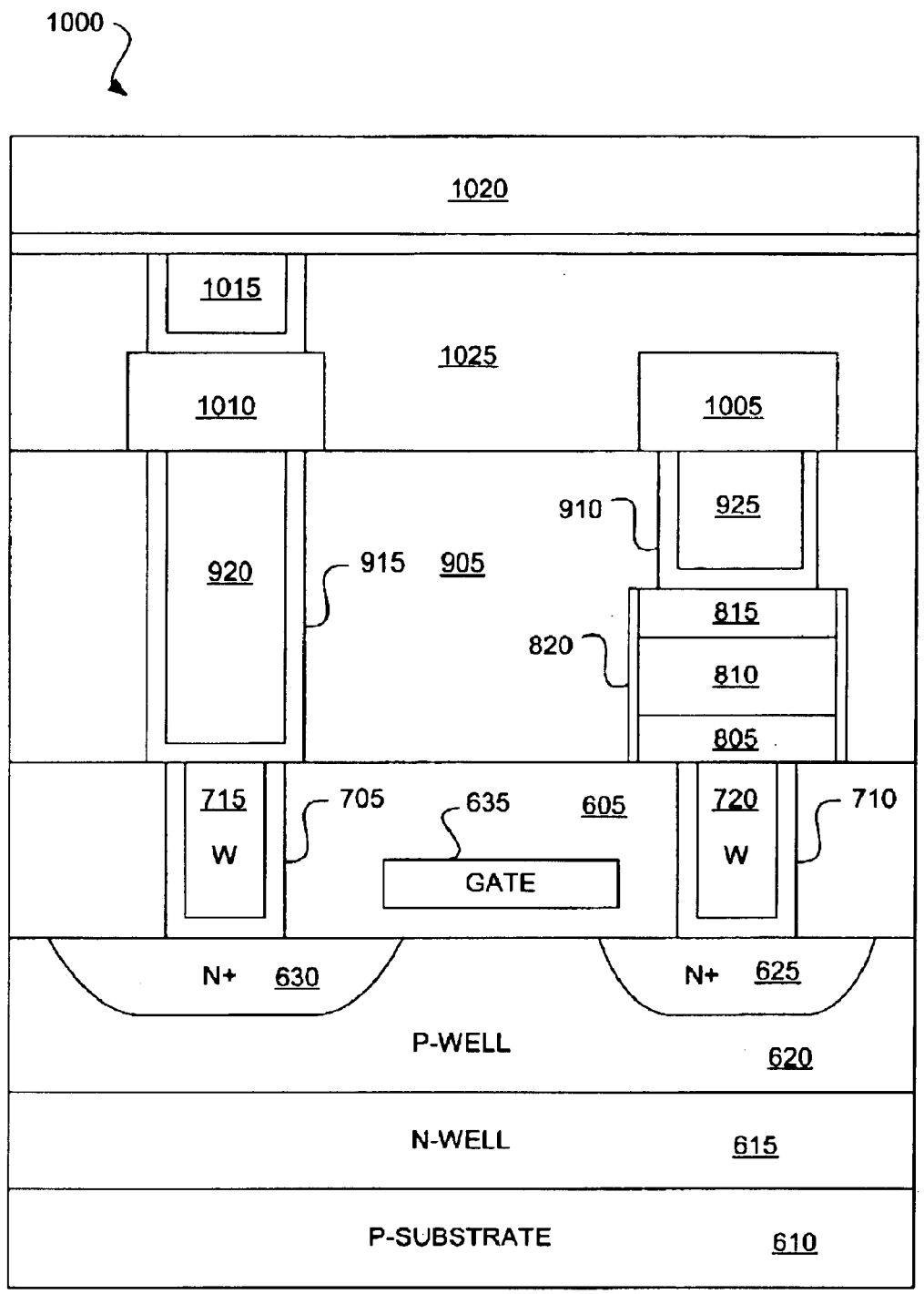
FIG. 10 depicts a cross sectional diagram of a completely formed cell.

FIG. 10 is a cross sectional diagram of a completely formed cell 1000. Using standard processes, two metalization layers can be formed above the partially formed cell 900 of FIG. 9. The first metalization layer can be used to form both the reference line 1005 and a metal pad 1010, which eventually connects two tungsten plugs 920 and 1015. The second tungsten plug 1015 is used to connect the data line 1020, which is formed during the second metalization layer, to the metal plug 1010, through a third ILD 1025, which is used to support the data line 1020.

Although the invention has been described in its presently contemplated best mode, it is clear that it is susceptible to numerous modifications, modes of operation and embodiments, all within the ability and skill of those familiar with the art and without exercise of further inventive activity. For example, the polarity of the read voltage could be alternated with each read or a n-channel device can be replaced by a p-channel device. Accordingly, that which is intended to be protected by Letters Patent is set forth in the claims and includes all variations and modifications that fall within the spirit and scope of the claim.

What is claimed is:

1. A non-volatile RAM memory array comprising:
   a plurality of memory cells formed on a semiconductor substrate, each cell capable of being selected through a select line and a data line, whereby the select line and the data line are perpendicular to each other, and having
      a transistor that controls current flow through the memory cell depending on the voltage of the select line;
      a multi-resistive state material that
         changes its resistive state from a high resistive state to a low resistive state upon application of a first voltage pulse across the multi-resistive state material;
         changes its resistive state from the low resistive state to the high resistive state upon application of a second voltage pulse across the multi-resistive state material, the second voltage pulse across the multi-resistive state material being of opposite polarity to the first voltage pulse; and
         maintains the resistive state even if power ceases to be supplied to the memory cell;
   wherein the resistive state of the memory cell determines the information stored in the memory cell; and
   wherein the first voltage pulse and the second voltage pulse have magnitudes between 1 and 10 volts and ate generated from a voltage supply ($V_{CC}$) that has been converted to by at least two on-chip voltage converters.

2. A non-volatile RAM memory array comprising:
   a plurality of memory cells formed on a semiconductor substrate, each cell capable of being selected through a select line and a data line, whereby the select line and the data line are perpendicular to each other, and having
      a transistor that controls current flow through the memory cell depending on the voltage of the select line;
      a multi-resistive state material that
         changes its resistive state from a high resistive state to a low resistive state upon application of a first voltage pulse across the multi-resistive state material;
         changes its resistive state from the low resistive state to the high resistive state upon application of a second voltage pulse across the multi-resistive state material, the second voltage pulse across the multi-resistive state material being of opposite polarity to the first voltage pulse; and
         maintains the resistive state even if power ceases to be supplied to the memory cell;
   wherein the resistive state of the memory cell determines the information stored in the memory cell; and
   wherein the multi-resistive state material has a resistivity of less than 5 Ω-cm.

3. A non-volatile RAM memory array comprising:
   a plurality of memory cells formed on a semiconductor substrate each cell capable of being selected through a select line and a data line, and having
      a semiconductor device that controls current flow depending on the voltage of the select line;
      a multi-resistive state material that
         changes its resistive state from a high resistive state to a low resistive state upon application of a first voltage pulse across the multi-resistive state material;
         changes its resistive state from the low resistive state to the high resistive state upon application of a second voltage pulse across the multi-resistive state material, the second voltage pulse across the multi-resistive state material being of opposite polarity to the first voltage pulse; and
         maintains the resistive state even if power ceases to be supplied to the memory cell;
   wherein
      the resistive state of the memory cell determines the information stored in the memory cell; and
      the memory cells are repeated in the direction of the select lines and are alternately flipped along the direction of the data lines.

4. The non-volatile RAM memory array of claim 3, wherein the reference line is parallel to the select line and spans two adjacent cells in data line direction.

5. The non-volatile RAM memory array of claim 3, wherein the select line is polysilicon material.

6. A non-volatile RAM memory array, comprising:
a plurality of memory cells formed on a semiconductor substrate, each cell capable of being selected through a select line and a data line, and having
  a semiconductor device that is formed on the semiconductor substrate and controls current flow depending on the voltage of the select line; and
  a multi-resistive state material that changes its resistive state between a low resistive state and a high resistive state upon application of a voltage pulse, wherein the resistive state of the memory cell determines the information stored in the memory cell; and
wherein the information stored in the plurality of memory cells can be maintained in the absence of power and
wherein the first voltage pulse and the second voltage pulse have magnitudes between 1 and 10 volts and are generated from a voltage supply ($V_{CC}$) that has been converted to by at least two on-chip voltage converters.

7. A non-volatile RAM memory array, comprising:
a plurality of memory cells formed on a semiconductor substrate, each cell capable of being selected through a select line and a data line, and having
  a semiconductor device that is formed on the semiconductor substrate and controls current flow depending on the voltage of the select line; and
  a multi-resistive are material that changes its resistive state between a low resistive state and a high resistive state upon application of a voltage pulse, wherein the resistive state of the memory cell determines the information stored in the memory cell; and
wherein the information stored in the plurality of memory cells can be maintained in the absence of power and
wherein the multi-resistive state material has a resistivity of less than 5 $\Omega$-cm.

8. A non-volatile RAM memory array comprising:
reference lines;
select lines; and
data lines that are orthogonal to the select lines; and
a plurality of memory cells electrically connected to the reference lines, each memory cell including
  a memory plug having a multi-resistive state material that has two terminals, the first terminal being electrically connected to one of the data lines; and
  a transistor having
    a source that is electrically connected to one of the reference lines;
    a drain that is electrically connected to the second terminal of the memory plug; and
    a gate that is electrically connected to one of the select lines
wherein the multi-resistive state material is a complex metal oxide.

* * * * *